United States Patent
Wang et al.

(10) Patent No.: US 12,077,842 B2
(45) Date of Patent: Sep. 3, 2024

(54) Mo DOPED AlCrSiN/Mo SELF-LUBRICATING FILMS AND PREPARATION METHOD THEREOF

(71) Applicant: TIANJIN UNIV. OF TECHNOLOGY AND EDUCATION (TEACHER DEVT. CENTER OF CHINA VOC. TRAINING AND GUIDANCE), Tianjin (CN)

(72) Inventors: Tiegang Wang, Tianjin (CN); Deqiang Meng, Tianjin (CN); Yanmei Liu, Tianjin (CN); Bing Yan, Tianjin (CN); Renren Xu, Tianjin (CN); Zhaoxing Yin, Tianjin (CN)

(73) Assignee: TIANJIN UNIVERSITY OF TECHNOLOGY AND EDUCATION (TEACHER DEVELOPMENT CENTER OF CHINA VOCATIONAL TRAINING AND GUIDANCE), Tianjin (CN)

( * ) Notice: Subject to any disclaimer, the term of this patent is extended or adjusted under 35 U.S.C. 154(b) by 262 days.

(21) Appl. No.: 17/655,907

(22) Filed: Mar. 22, 2022

(65) Prior Publication Data
US 2022/0213588 A1 Jul. 7, 2022

Related U.S. Application Data

(63) Continuation-in-part of application No. PCT/CN2019/125596, filed on Dec. 16, 2019.

(30) Foreign Application Priority Data

Sep. 23, 2019 (CN) .......................... 201910897038.6

(51) Int. Cl.
*C23C 14/06* (2006.01)
*C23C 14/02* (2006.01)
*C23C 14/35* (2006.01)

(52) U.S. Cl.
CPC ........ *C23C 14/0641* (2013.01); *C23C 14/024* (2013.01); *C23C 14/352* (2013.01)

(58) Field of Classification Search
None
See application file for complete search history.

(56) References Cited

U.S. PATENT DOCUMENTS

2011/0111193 A1\* 5/2011 Lechthaler ............ C23C 28/044
428/213
2019/0093768 A1 3/2019 Lima Sarabanda et al.

FOREIGN PATENT DOCUMENTS

CN 102149844 A 8/2011
CN 102296269 A 12/2011
(Continued)

OTHER PUBLICATIONS

Feng—CN 104928637 A—PCT D1—MT—metal coating—2015 (Year: 2015).*

(Continued)

*Primary Examiner* — John Vincent Lawler
(74) *Attorney, Agent, or Firm* — NKL Law; Allen Xue

(57) ABSTRACT

Mo doped AlCrSiN/Mo self-lubricating films and a preparation method thereof are provided. The AlCrSiN/Mo self-lubricating films are prepared by doping Mo element into the AlCrSiN films, and the Mo content in the resulted films is in the range of 0.3-6.3 at. %. The films are prepared on the substrates by high power impulse magnetron sputtering (HiPIMS) and pulsed DC magnetron sputtering hybrid coating technology. The prepared AlCrSiN/Mo self-lubricating
(Continued)

films possess high hardness, good toughness, excellent anti-friction characteristics and good chemical stability.

11 Claims, 6 Drawing Sheets

(56) References Cited

FOREIGN PATENT DOCUMENTS

| CN | 104928637 A | * | 9/2015 | ............. C23C 14/06 |
| CN | 105624623 A | * | 6/2016 | ............. C23C 14/02 |
| CN | 107130222 A | * | 9/2017 | ........... C23C 14/022 |
| CN | 110453190 A |   | 11/2019 | |

OTHER PUBLICATIONS

Lou—CN 105624623 A—PCT D2—MT—metal coating—2016 (Year: 2016).*
Tao—CN 107130222 A—MT—CrAlSiN film—comp outside claimed—2017 (Year: 2017).*
Lukaszkowicz—CrAlSiN+MoS2 coatings—Vacuum—Mar+May 2019 (Year: 2019).*
Chen—AlCrSiN coatings—nearly claimed comp. w—Mo—Appl. Surf.Sci.—2016 (Year: 2016).*

* cited by examiner

Mo DOPED AlCrSiN/Mo SELF-LUBRICATING FILMS AND PREPARATION METHOD THEREOF

CROSS-REFERENCE TO RELATED APPLICATIONS

This application is a continuation-in-part of PCT International Application No. PCT/CN2019/125596, filed Dec. 16, 2019, which claims the benefit of the priority of Chinese Application No. 201910897038.6, filed Sep. 23, 2019, the contents of which are incorporated herein by reference in their entities.

TECHNICAL FIELD

The present invention relates to the technical field of films, and in particular to a kind of Mo doped AlCrSiN/Mo self-lubricating films and a preparation method thereof.

BACKGROUND

With the rapid development of modern manufacturing technology, a variety of difficult-to-machining materials are increasing, which proposes higher requirements for cutting performance of tools. With the wide application of new technologies such as high speed cutting, super hard cutting, and dry cutting, the traditional tool coatings fail to meet the requirements for high temperature resistance. Therefore, it is urgent to develop tool coatings with self-lubricating function to reduce the friction and cutting heat between rake face and chip, and between flank and machined surface, thus to prolong the service life of coated tools and improve the surface quality of workpiece and machining efficiency.

Quaternary AlCrSiN nanocomposite film, whose microstructure is composed of nanocrystalline nc-(Al,Cr)N wrapped by amorphous phase a-$Si_3N_4$, makes it possess the advantages of high hardness, high toughness, and excellent thermal stability, etc. However, AlCrSiN nanocomposite film has a high friction coefficient, which produces a lot of cutting heat during machining process by coated tool and lead to high cutting temperature. As a result, the service life of coated tool is shortened and the surface quality of workpiece is impaired. The transition metal Mo is easy to react with O in the air to form $MoO_3$ during the friction process. $MoO_3$ with a layered structure and a low shear modulus is often used as the solid lubricant. Therefore, the present invention applies high power impulse magnetron sputtering and pulsed DC magnetron sputtering hybrid coating technology to fabricate the AlCrSiN/Mo self-lubricating films on cutting tool surface. The coated tools obtain higher hardness, good heat resistance and antifriction as well as wear resistance. The present invention is applicable to the field of modern high-speed dry cutting, aims to further prolong the service life of coated tools and improve machining efficiency.

SUMMARY

The purpose of the invention is to provide a kind of Mo doping AlCrSiN/Mo self-lubricating films and a preparation method thereof. The prepared AlCrSiN/Mo self-lubricating films have high hardness, good toughness, excellent anti-friction properties, which can significantly reduce the friction and cutting heat between rake face and chip, and between flank and machined surface. Meanwhile, the stated films maintain a good chemical stability and a lubrication characteristic of easy shear delamination.

In order to realize the above purpose, the present invention adopts the following technical solution:

The invention relates to a kind of Mo doped AlCrSiN/Mo self-lubricating films, which is obtained by doping Mo element into AlCrSiN film, and the Mo content in the resulted films is in the range of 0.3-6.3 at. %. In atomic percentage terms, the detailed chemical composition of the AlCrSiN/Mo self-lubricating films are as follows:

Al: 14.3-25.5 at. %, Cr: 14.3-36.2 at. %, Si: 1.6-3.4 at. %, N: 33.6-56.9 at. %, Mo: 0.3-6.3 at. %.

The AlCrSiN/Mo self-lubricating films consist of multiphase. The doped Mo atom replaced the Al and/or Cr atom sites in the (Al,Cr)N lattice to form substitutional solid solution, and caused lattice distortion and increased hardness. The AlCrSiN/Mo self-lubricating films are composed of AlN, CrN, and $Mo_2N$ nanocrystalline embedded in the amorphous phase to form a nanocomposite structure.

The CrN transition layer is deposited between the AlCrSiN/Mo self-lubricating film and the substrate. The substrate materials contain stainless steel, monocrystal Si wafer, tungsten steel, and carbide. The thickness of CrN transition layer is about 150-250 nm, and the thickness of AlCrSiN/Mo self-lubricating film is about 2.5-4.0 μm.

The Mo doped AlCrSiN/Mo self-lubricating films are fabricated on substrate surface by high power impulse magnetron sputtering and pulsed DC magnetron sputtering hybrid coating technology. The preparation method specifically comprises the following steps:

(1) Fixing the substrate on the rotating holder in the vacuum chamber; then pumping the base pressure in coating chamber to less than $3.0\times10^{-3}$ Pa; connecting a Cr target to the arc power supply, and connecting a CrMo target to the high power impulse magnetron sputtering power supply, and connecting a AlCrSi target to the pulsed DC magnetron sputtering power supply.

(2) Carrying out glow discharge cleaning on the substrate to remove surface impurities; then conducting ion bombardment cleaning to improve the adhesion between the film and substrate.

(3) Depositing the CrN transition layer.

(4) Depositing the AlCrSiN/Mo self-lubricating films: after the CrN transition layer is deposited, the bias voltage is adjusted to −50−−150 V; and the reactive gas $N_2$ with a flow rate of 50-150 sccm and Ar with a flow rate of 50-250 sccm are introduced into the coating chamber. The total flow of $N_2$ and Ar are 300 sccm; and the deposition pressure is maintained at 1.0-2.5 Pa. The sputtering power of CrMo target and AlCrSi target are controlled to be 0.1-0.9 kW and 0.2-1.5 kW, respectively; and the AlCrSiN/Mo self-lubricating films are deposited.

In the above step (1), before the substrates are fixed on the rotating holder, they are firstly cleaned in sequence in acetone and ethanol by ultrasonic cleaning for 10-35 min; and then blow-dried with high purity nitrogen.

In the above step (2), the mentioned cleaning process of glow discharge is: applying a bias of −800 V; Ar with a flow rate of 50-200 sccm is passed through; the throttle valve is adjusted to maintain the working pressure of 0.5-1.5 Pa; and the substrate surface is cleaned by glow discharge for 5-15 min to remove the impurities.

In the above step (2), the mentioned ion bombardment process is: an arc Cr target is started for ion bombardment; the arc current is set at 80-100 A, and the arc voltage is set at 15 V-25 V; Ar with a flow rate of 50-200 sccm is introduced; the working pressure is maintained at $(5-10)\times 10^{-1}$ Pa; and the bombardment time is 5-10 min.

In the above step (3), after ion bombardment, the arc Cr target parameters are maintained unchanged; Ar with a flow rate of 40-60 sccm and $N_2$ with a flow rate of 150-250 sccm are introduced into the coating chamber; the working pressure is maintained at $8.0\times10^{-1}$ Pa; and the CrN transition layer is deposited for 10-20 min.

In the above step (4), the deposition time is determined according to the technical requirements and the deposition rate of films.

The design mechanism of the present invention is as follows:

The present invention clops the sixth subgroup Mo element into the AlCrSiN films, and the doped Mo atom replaced the Al and/or Cr atom sites in the (Al,Cr)N lattice to form substitutional solid solution. Different atomic radii can cause lattice distortion, to realize grain boundary strengthening through increasing the resistance of dislocation movement between grain boundaries. As a result, the performance of AlCrSiN/Mo films is improved. At the same time, it is easy to form the layered $MoO_3$ with self-lubricating function during the friction process, which can effectively reduce the friction coefficient and the cutting heat, and play an important antifriction role. It is found that the Mo content has a great influence on the properties of resulted films. The lubrication effect will be not obvious when the Mo content is too low. But, If the Mo content is too high and the nitriding reaction cannot be completed, the hardness of resulted films will decrease.

The present invention makes use of the technical advantages of high power impulse magnetron sputtering, such as high instantaneous current density, high ionization rate, high sputtering energy, and low duty (<1%), etc., to fabricate high quality films with compact structure, smooth surface, and adjustable internal stress. Combined with the advantages of pulsed DC magnetron sputtering such as high deposition rate and low deposition temperature, the AlCrSiN/Mo self-lubricating films are prepared on the surface of SUS304 stainless steel, monocrystal Si wafer, tungsten steel, and carbide. During the coating deposition, the process parameters such as reactive gas flow rate, sputtering power, and deposition pressure are strictly controlled. On the premise of ensuring the hardness and toughness of the film, the friction reduction and wear resistance are achieved. This invention utilizes nanocomposite structure and solid solution strengthening mechanism to improve the performance of AlCrSiN/Mo films, which is suitable for modern machining fields such as dry cutting and high-speed cutting. The service life of coated tools can be prolonged significantly and machining efficiency can be further improved.

The present invention has the following advantages and beneficial effects:

(1) The AlCrSiN/Mo thin films are composed of AlN, CrN, and $Mo_2N$ nanocrystalline embedded in the amorphous phase to form a nanocomposite structure, which has high hardness, high toughness, low friction coefficient, and good wear resistance.

(2) The AlCrSiN/Mo thin films developed by this invention have smooth surface, dense structure, and good adhesion between the film and substrate. The critical load is more than 150N the friction coefficient is less than 0.20, and the wear rate is low.

(3) The AlCrSiN/Mo nanocomposite films developed by this invention have excellent thermal stability, and the coated tools can be used in the fields of high speed cutting, and dry cutting, etc.

(4) The preparation process of the AlCrSiN/Mo thin films developed by this invention has good repeatability, and has a broader application prospect. The coated tools can be used for cutting various difficult-to-machining materials.

DETAILED DESCRIPTION

The technical solution of the present invention is further described below in combination with the specific embodiments.

Embodiment 1

Figure 1:
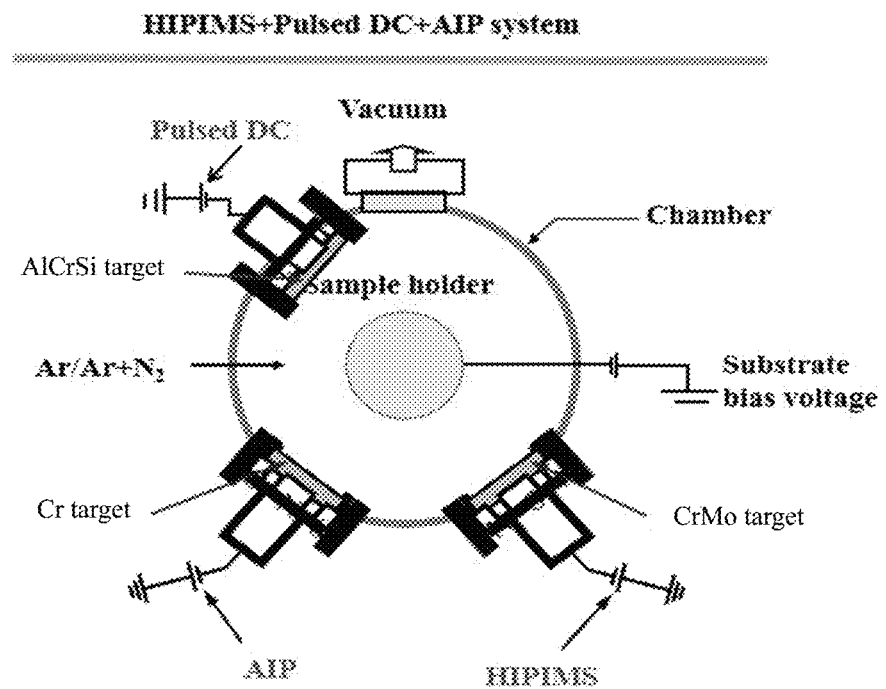
FIG. 1 shows the layout of targets for preparing AlCrSiN/Mo films in embodiment 1.

In the present embodiment, the AlCrSiN/Mo films are deposited respectively on monocrystal Si wafer (40×40×0.67 $mm^3$), SUS304 stainless steel sheet (40×40×2.0 $mm^3$), and cemented carbide sheet (35×35×4.5 $mm^3$) by HiPIMS and pulsed DC magnetron sputtering hybrid coating technology. The preparation process of the AlCrSiN/Mo films is as follows:

(1) All substrates are cleaned in sequence in acetone and ethanol by ultrasonic cleaning for 30 min; and then blow-dried with high purity nitrogen and fixed on the rotating holder in the vacuum chamber. FIG. 1 shows the layout of targets for preparing AlCrSiN/Mo films. It can be seen, a Cr target is connected to the arc power supply, and a CrMo target is connected to high power impulse magnetron sputtering power supply, and a AlCrSi target is connected to pulsed DC magnetron sputtering power supply.

The rotating speed of holder is set at 2.5 r/min, and the distance between target surface and substrate is 80 mm (AlCrSi target), 80 mm (CrMo target), and 280 mm (Cr target), respectively. The high purity Ar and $N_2$ are used as working gas and reactive gas, respectively. The purity of both is 99.999%.

(2) Glow discharge cleaning: pumping the base pressure in coating chamber to less than $3.0 \times 10^{-3}$ Pa; heating the substrate to 400° C.; applying a bias of −800 V; introducing Ar with a flow rate of 200 sccm into the vacuum chamber; adjusting a throttle valve to maintain a working pressure of 1.5 Pa; glow discharge cleaning for 15 min to remove the impurities on the substrate surface.

(3) Ion bombardment cleaning: an arc Cr target is started for ion bombardment; the arc current is set at 90 A, and the arc voltage is set at 20.0 V-20.3 V; Ar with a flow rate of 200 sccm is introduced; the working pressure is maintained at $5.0 \times 10^{-1}$ Pa by controlling the throttle valve; and the bombardment time is 8 min.

(4) Depositing the CrN transition layer: the arc Cr target parameters are kept unchanged; Ar with a flow rate of 50 sccm and $N_2$ with a flow rate of 200 sccm are introduced into the coating chamber; the working pressure is maintained at $8.0 \times 10^{-1}$ Pa; and the CrN transition layer is deposited for 15 min to obtain a thickness of 200 nm. It can reduce the mismatch of thermal expansion coefficient between the film and substrate and improve the adhesion.

(5) Depositing the AlCrSiN/Mo self-lubricating films: the bias voltage is adjusted to −150 V; and the reactive gas $N_2$ with a flow rate of 50 sccm and Ar with a flow rate of 250 sccm are introduced into the coating chamber. The total flow of $N_2$ and Ar are 300 sccm; and the deposition pressure is maintained at 2.0 Pa. The sputtering power of AlCrSi target is set to 1.5 kW, and the sputtering power of CrMo target is set to 0.3 kW, 0.6 kW, and 0.9 kW, respectively; the deposition time is controlled at 240 min. A series of the AlCrSiN/Mo self-lubricating films are prepared.

The microstructure and properties of the AlCrSiN/Mo films prepared in the present embodiment are characterized and tested. The detailed results are as follows:

The surface and cross-section morphologies of the films are observed by Hitachi cold-field emission scanning electron microscopy (SEM, SU8010). An electron probe micro analyzer (EPMA, Shimadzu, EPMA 1600) is used to analyze the composition of the films. X-ray diffractometer D8-Discovery Brucker) is used for phase analysis of the films. X-ray diffraction data is collected by step scanning. The characteristic spectrum line of Cu target Kα (λ0.154056 nm) is used for radiation of the incident X-ray. The scanning range is 20-80", the scanning step length is 0.02", and the counting time of each step is 0:2 s.

Scratch tester (Anton Paar RST-3) is used to measure the adhesion between the film and carbide substrate. The cone angle and radius of the diamond tip are 120° and 100 μm, respectively. During the scratch tests, the normal load is increased gradually up to 150 N with a loading rate of 1 N/s and a translation speed of 0.1 mm/s, and the scratch length was set as 15 mm. The friction force, friction coefficient, and acoustic emission signals are also recorded by computer in real time in order to identify the critical load.

The friction coefficient of the film is tested by a tribometer (Anton Paar THT). An $Al_2O_3$ ball with a diameter of 5.99 mm (hardness of 22±1 GPa) is chosen as a counterpart. The sliding friction tests are conducted with a sliding speed of 10 cm/s, a constant normal load of 6 N, and a total sliding distance of 125.6 in (4 mm in diameter of wear track). All experiments are repeated three times in controlled room temperature (25±3° C.) and relative humidity (30% RH). The formula $W=V/(F \times S)$ is used to calculate the wear rate of the film (V is the wear volume, is the load, and S is the sliding distance). In addition, a microscope with super wide depth of field (VHX-1000C, KEYENCE) is used to observe the wear morphology of the film.

The chemical composition of the AlCrSiN/Mo self-lubricating films prepared in this embodiment is shown in Table 1.

TABLE 1

Composition of the AlCrSiN/Mo self-lubricating films prepared applying different sputtering powers of CrMo target

| Sputtering power of CrMo target (kW) | Al (at. %) | Cr (at. %) | Mo (at. %) | Si (at. %) | N (at. %) |
| --- | --- | --- | --- | --- | --- |
| 0.3 | 20.8 | 22.7 | 2.5 | 2.2 | 51.8 |
| 0.6 | 18.4 | 25.7 | 3.8 | 2.0 | 50.1 |
| 0.9 | 15.5 | 28.8 | 4.9 | 1.7 | 49.1 |

Figure 2:
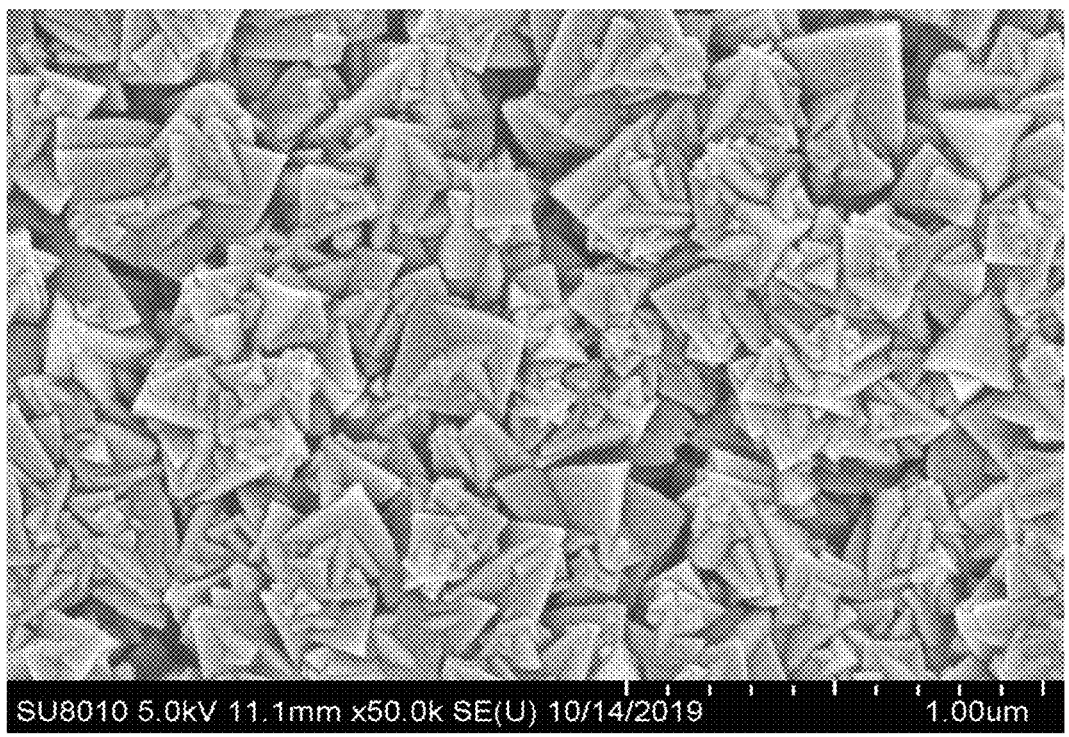
FIG. 2 shows the surface morphology of the AlCrSiN/Mo film in embodiment 1.
Figure 3:
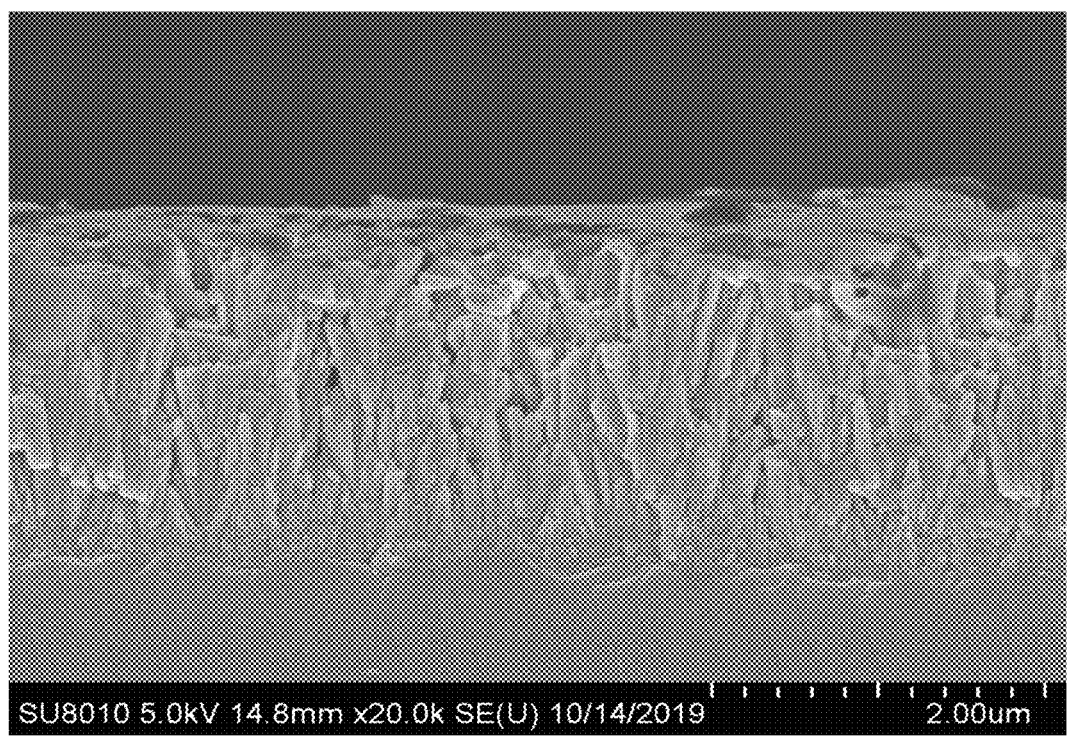
FIG. 3 shows the cross-section morphology of the AlCrSiN/Mo film in embodiment 1.

FIG. 2 shows the surface morphology of the prepared AlCrSiN/Mo thin film (sputtering power of CrMo target is 0.6 kW). As can be seen from the figure, the surface microparticles are rhombohedral, and all the particle sizes are at the nanometer level. The reason is that the fine (Al,Cr)N and $Mo_2N$ nanocrystals are wrapped by amorphous $Si_3N_4$ phase, which effectively inhibits the grain growth. FIG. 3 shows the cross-section morphology of the AlCrSiN/Mo film (sputtering power of CrMo target is 0.6 kW). The film exhibits columnar crystal structure, and no grains grow throughout the entire film thickness. The top of columnar crystal with larger size corresponds to the rhomboid crystal cell in the surface morphology. The higher the sputtering power of target, the stronger migration ability for the particle on the film surface, which makes great contributions to the columnar crystal growth.

Figure 4:
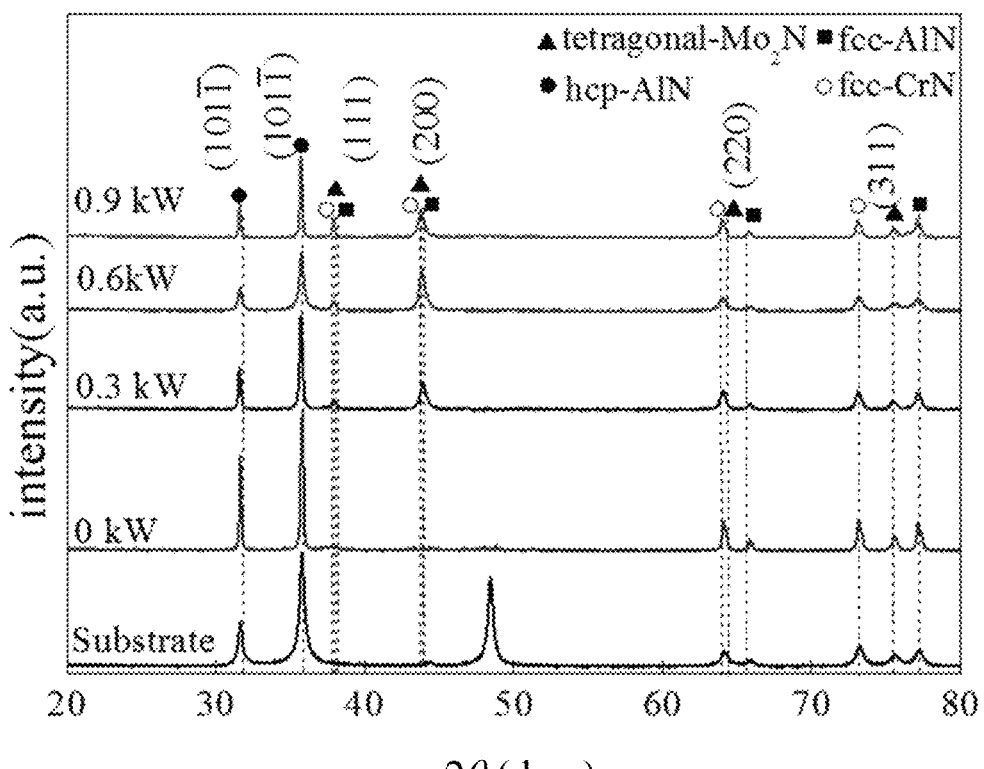
FIG. 4 shows the XRD pattern of the AlCrSiN/Mo films in embodiment 1.

FIG. 4 shows the XRD pattern of the prepared AlCrSiN/Mo thin films. At 2θ=31.4° and 35.8°, the hcp-AlN diffraction peak can be detected along the (1011) crystal plane, whose intensity decreases with the increase of target sputtering power. In the vicinity of 2θ=37.8°, 43.9°, 64.1°, and 75.5°, three diffraction peaks of fcc-AlN, tetra-$Mo_2N$, and fcc-CrN can be detected along the (111), (200), (220), and (311) each crystal plane. The diffraction peaks on the (200) crystal plane are slightly stronger. The (Al,Cr)N phase has the lowest surface energy due to its NaCl-shaped face-centered cubic structure and the low density for suspended bonds and non-equilibrium bonds on the (200) crystal plane. According to the principle of minimum thermodynamic free energy, the higher the sputtering power of target, the stronger atomic migration ability for the sputtered particle on the film surface, which will promote the grains grow preferentially along the (200) crystal plane with the minimum surface free energy.

Figure 5:
FIG. 5 shows the scratch morphology of the AlCrSiN/Mo film in embodiment 1.

FIG. 5 shows the scratch morphology of the prepared AlCrSiN/Mo film (sputtering power of CrMo target is 0.6 kW). Even if the normal load reaches 150 N, the film is not stripped. The reason is that a large number of metal ions are evaporated during the arc ion plating process, and the substrate surface is etched by high energy and high density ion beam under the action of negative bias electric field. A good chemical bonding interface is obtained, which greatly improves the adhesion between the film and substrate. In addition, the scratch surface is white, which is due to gradual oxidation of Mo element on the film surface during the scratch test.

Figure 6:
FIG. 6 shows the worn scar of the AlCrSiN/Mo film after grinding with alumina ball in embodiment 1.

FIG. 6 shows the worn scar of the prepared AlCrSiN/Mo film after grinding with alumina ball (sputtering power of CrMo target is 0.6 kW). There are many micro furrows distributed in the worn scar. This is because some hard fragments of the film are easy to peel off under the cyclic action of normal load and tangential load, and gradually transfer and gather at the friction interface to form three body abrasion. The constant abrasion on the film surface causes fatigue damage. The main wear mechanism of the AlCrSiN/Mo film is slight abrasive wear. In addition, a small amount of white debris is remained at the edge of worn scar, which is attributed to the occurrence of fatigue damage after repeated grinding between alumina ball and film under high load and long sliding distance, and leads to local film falling off.

Figure 7:
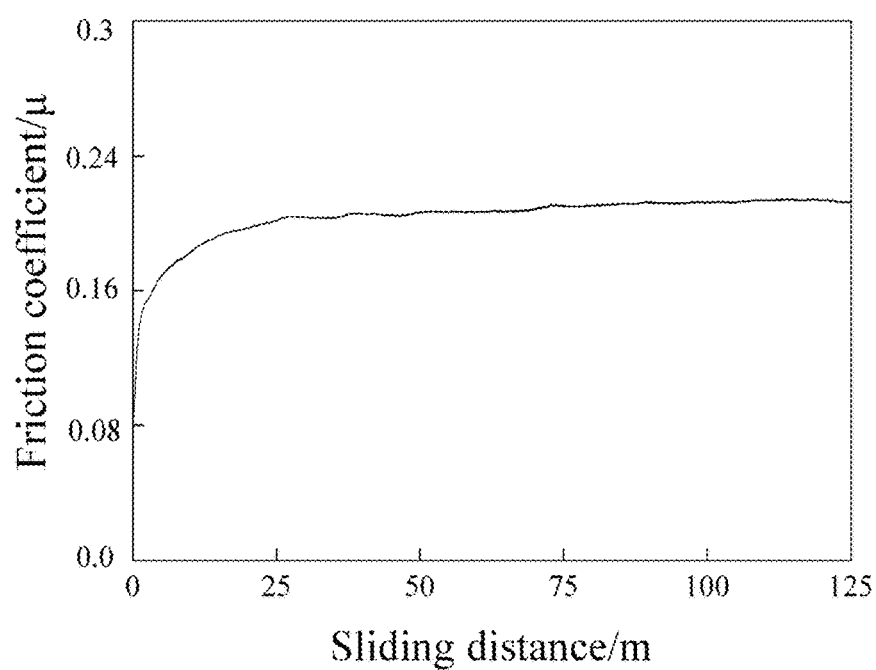
FIG. 7 shows the friction coefficient of the AlCrSiN/Mo film in embodiment 1.

FIG. 7 shows the friction coefficient of the prepared AlCrSiN/Mo thin film (sputtering power of CrMo target is 0.6 kW). In the initial running-in phase, the friction coefficient rises rapidly. After the friction entering steady-state phase, the friction coefficient still fluctuates slightly, which is due to the frequent spallation of hard particles in film, and are transferred to the friction interface to participate in friction, resulting in abrasive wear. By virtue of the lubricating phase in the AlCrSiN/Mo film, the friction coefficient finally stabilizes at about 0.19, and the wear rate is about $1.64 \times 10^{-3}$ μm$^3$/N·μm.

Embodiment 2

In this embodiment, a HIPIMS/Pulsed DC hybrid magnetron sputtering system is used to deposit the AlCrSiN/Mo films on monocrystal Si wafer (40 mm×40 mm×0.67 mm), SUS304 stainless steel sheet (40 mm×40 mm×2.0 mm), and cemented carbide sheet (35 mm×35 mm×4.5 mm) by HiPIMS and pulsed DC magnetron sputtering hybrid coating technology. The detailed preparation process of the AlCrSiN/Mo films is as follows:

(1) All substrates are cleaned in sequence in acetone and ethanol by ultrasonic cleaning for 30 min; and then blow-dried with high purity nitrogen and fixed on the rotating holder in the vacuum chamber. A Cr target is connected to the arc power supply, and a AlCrSi target is connected to HiPIMS power supply, and a CrMo target is connected to pulsed DC magnetron sputtering power supply.

The rotating speed of holder is set at 2.5 r/min, and the distance between target surface and substrate is 80 mm (AlCrSi target), 80 mm (CrMo target), and 280 mm (Cr target), respectively. The high purity Ar and N$_2$ are used as working gas and reactive gas, respectively. The purity of both is 99.999%.

(2) Glow discharge cleaning: pumping the base pressure in coating chamber to less than $3.0 \times 10^{-3}$ Pa; heating the substrate to 400° C.; applying a bias of −800 V; introducing Ar with a flow rate of 200 sccm into the vacuum chamber; adjusting a throttle valve to maintain a working pressure of 1.5 Pa; glow discharge cleaning for 15 min to remove the impurities on the substrate surface.

(3) km bombardment cleaning: an arc Cr target is started for ion bombardment; the arc current is set at 90 A, and the arc voltage is set at 20.0 V-20.3 V; Ar with a flow rate of 200 sccm is introduced; the working pressure is maintained at $5.0 \times 10^{-1}$ Pa by controlling the throttle valve; and the bombardment time is 8 min.

(4) Depositing the CrN transition layer: the arc Cr target parameters are kept unchanged; Ar with a flow rate of 50 sccm and N$_2$ with a flow rate of 200 sccm are introduced into the coating chamber; the working pressure is maintained at $8.0 \times 10^{-1}$ Pa; and the CrN transition layer is deposited for 15 min to obtain a thickness of about 200 nm.

(5) Depositing the AlCrSiN/Mo self-lubricating films: the bias voltage is adjusted to −150 V; and the reactive gas N$_2$ with a flow rate of 50 sccm and Ar with a flow rate of 200 sccm are introduced into the coating chamber. Adjusting the throttle valve to maintain the deposition pressure at 1.0 Pa, 1.2 Pa, 1.6 Pa, and 2.0 Pa, respectively. The sputtering power of AlCrSi target is set to 1.2 kW, and the sputtering power of CrMo target is set to 0.4 kW; the deposition time is controlled at 360 min. A series of the AlCrSiN/Mo self-lubricating films are prepared.

The microstructure and properties of the AlCrSiN/Mo films prepared in this embodiment are characterized and tested. The detailed results are as follows:

The surface and cross-section morphologies of the films are observed by Hitachi cold-field emission scanning electron microscopy (SEM, SU8010). An electron probe micro analyzer (EPMA, Shimadzu, EPMA 1600) is used to analyze the composition of the films. X-ray diffractometer (RD, D8-Discovery Brucker) is used for phase analysis of the films. X-ray diffraction data is collected by step scanning. The characteristic spectrum line of Cu target Kα (λ=0.154056 nm) is used for radiation of the incident X-ray. The scanning range is 20-80°, the scanning step length is 0.02°, and the counting time of each step is 0.2 s.

Scratch tester (Anton Paar RST-3) is used to measure the adhesion between the film and carbide substrate. The cone angle and radius of the diamond tip are 120° and 100 μm, respectively. During the scratch tests, the normal load is increased gradually up to 150 N with a loading rate of 1 N/s and a translation speed of 0.1 mm/s, and the scratch length was set as 15 mm. The friction force, friction coefficient, and acoustic emission signals are also recorded by computer in real time in order to identify the critical load.

The friction coefficient of the film is tested by a tribometer (Anton Paar THT). An Al$_2$O$_3$ ball with a diameter of 5.99 mm (hardness of 22±1 GPa) is chosen as a counterpart. The sliding friction tests are conducted with a sliding speed of 10 cm/s, a constant normal load of 6 N. and a total sliding distance of 125.6 m (4 mm in diameter of wear track). All experiments are repeated three times in controlled room temperature (25±3° C.) and relative humidity (30% RH). The formula W=V/(F×S) is used to calculate the wear rate of the film (V is the wear volume, F is the load, and S is the sliding distance). In addition, a microscope with super wide depth of field (VHX-1000C, KEYENCE) is used to observe the wear morphology of the film.

The chemical composition of the AlCrSiN/Mo self-lubricating films prepared in this embodiment is shown in Table 2.

TABLE 2

Composition of the AlCrSiN/Mo self-lubricating films prepared under different deposition pressures

| Deposition Pressure (Pa) | Al (at. %) | Cr (at. %) | Mo (at. %) | Si (at. %) | N (at. %) |
|---|---|---|---|---|---|
| 1.0 | 20.9 | 36.2 | 6.3 | 3.0 | 33.6 |
| 1.2 | 18.6 | 32.9 | 5.8 | 2.6 | 40.1 |
| 1.6 | 16.4 | 31.2 | 5.1 | 1.9 | 45.4 |
| 2.0 | 14.3 | 30.5 | 5.9 | 1.6 | 47.7 |

Figure 8:
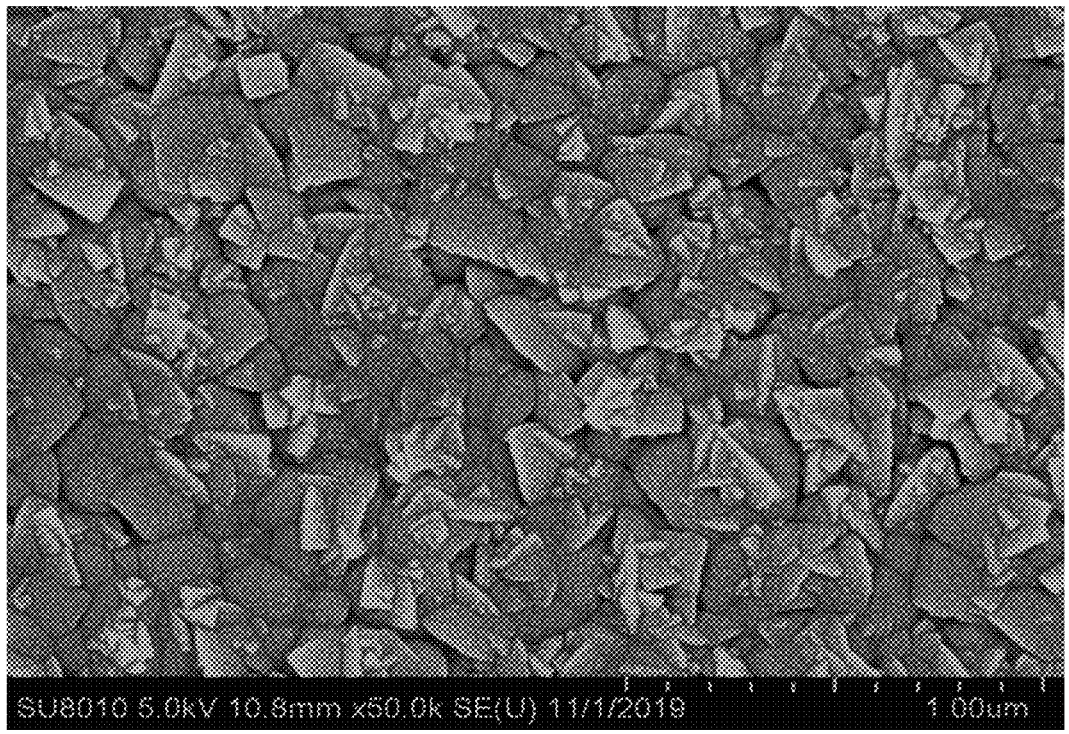
FIG. 8 shows the surface morphology of the AlCrSiN/Mo film in embodiment 2.
Figure 9:
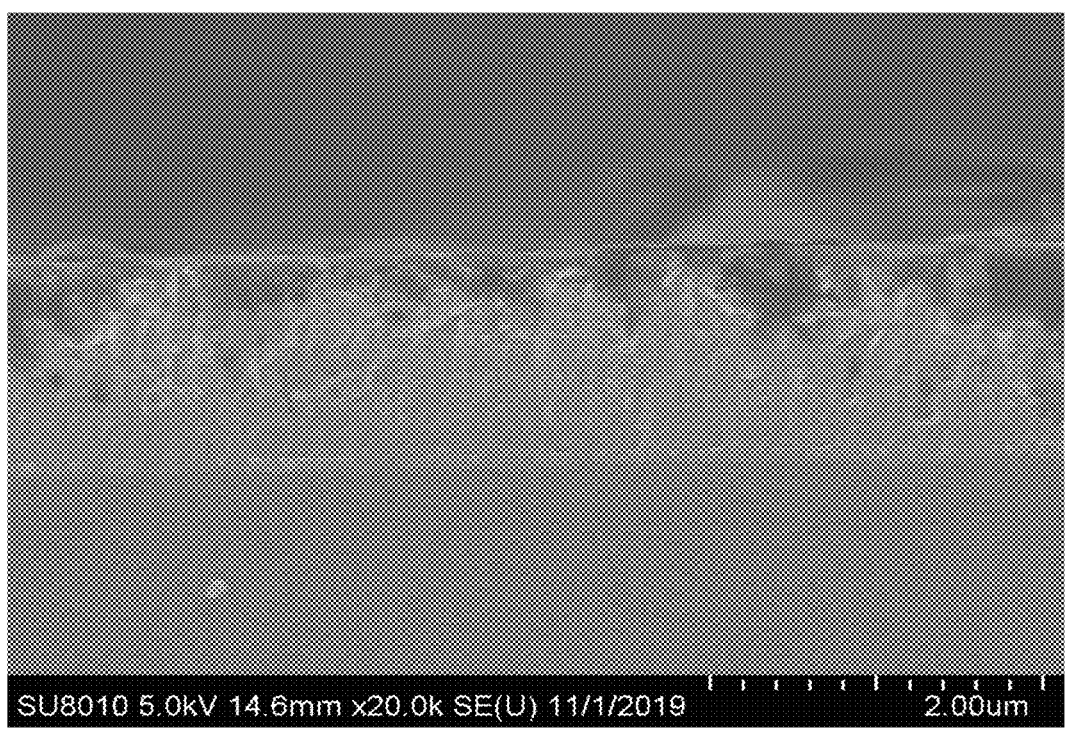
FIG. 9 shows the cross-section morphology of the AlCrSiN/Mo film in embodiment 2.

FIG. 8 shows the surface morphology of the prepared AiCrSiN/Mo thin film (deposition pressure is 1.6 Pa). It can be seen the film shows obvious crystallographic characteristics, and the microparticles on its surface are irregular and non-rhombic. The microparticle size is also smaller than that in FIG. 2 for the film prepared in embodiment 1. It is well known that the film composition mainly comes from the substance sputtered applying a higher sputtering power. In embodiment 1, the sputtering power of pulsed DC magnetron sputtering is higher than that of HiPIMS, whereas in embodiment 2 the reverse is true. HiPIMS with higher ionization rate can fabricate the films with smooth surface and dense structure, but its deposition efficiency is lower than that of pulsed DC magnetron sputtering. Therefore, the grain growth of the film in embodiment 2 is slower than that in embodiment 1. FIG. 9 shows the cross-section morphology of the AiCrSiN/Mo film (deposition pressure is 1.6 Pa). The AlCrSiN/Mo film exhibits columnar or near-columnar microstructure. The average width of columnar grains is less than 100 nm, which is also indicative of a nano-scale grain size for the prepared AlCrSiN/Mo film. The CrN transition layer adheres well to the substrate, Neither pinholes nor pores can be observed in the columnar structure. There are also no grains grow throughout the entire film thickness. The film microstructure in this embodiment is denser than that of the film prepared in embodiment 1. The detailed reasons have been discussed above.

Figure 10:
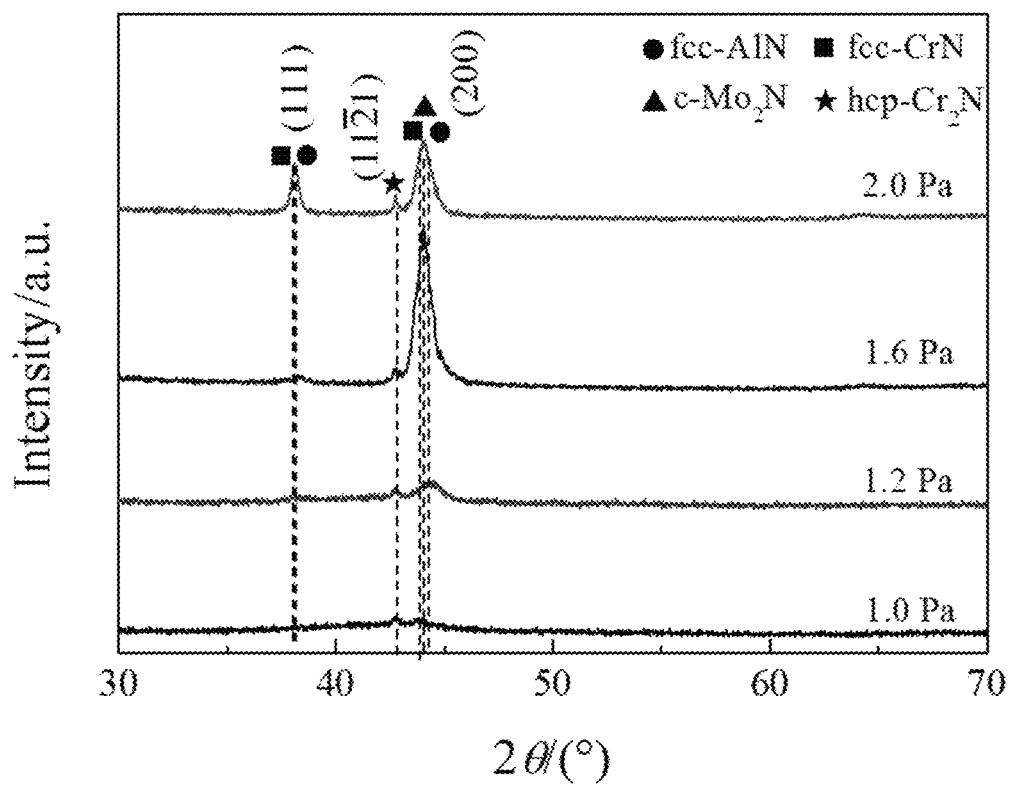
FIG. 10 shows the XRD pattern of the AlCrSiN/Mo films in embodiment 2.

FIG. 10 shows the XRD pattern of the AlCrSiN/Mo thin films. As can be seen from the figure, the AlCrSiN/Mo films presents polycrystalline state, are mainly composed of AlN, CrN, $Mo_2N$, and $Cr_2N$ nanocrystals. In the vicinity of $2\theta=37.9°$ and $43.7°$, the diffraction peaks of AlN, CrN, and $Mo_2N$ on (111) crystal plane and (200) crystal plane are respectively detected. When the deposition pressure is 1.6 Pa, the diffraction peaks on (200) crystal plane for the prepared AlCrSiN/Mo film are the strongest. This is because nitrogen reacts fully with sputtered ions and the film crystallizes well. At $2\theta=42.6°$, the $Cr_2N$ phase with close packed hexagonal structure is detected and grows along (112 1) crystal plane. In addition, the diffraction peaks of Si simple substance and Si containing compound are not detected in all the films, which indicates Si element maybe exist in amorphous phase. The latter can inhibit grain growth.

Figure 11:
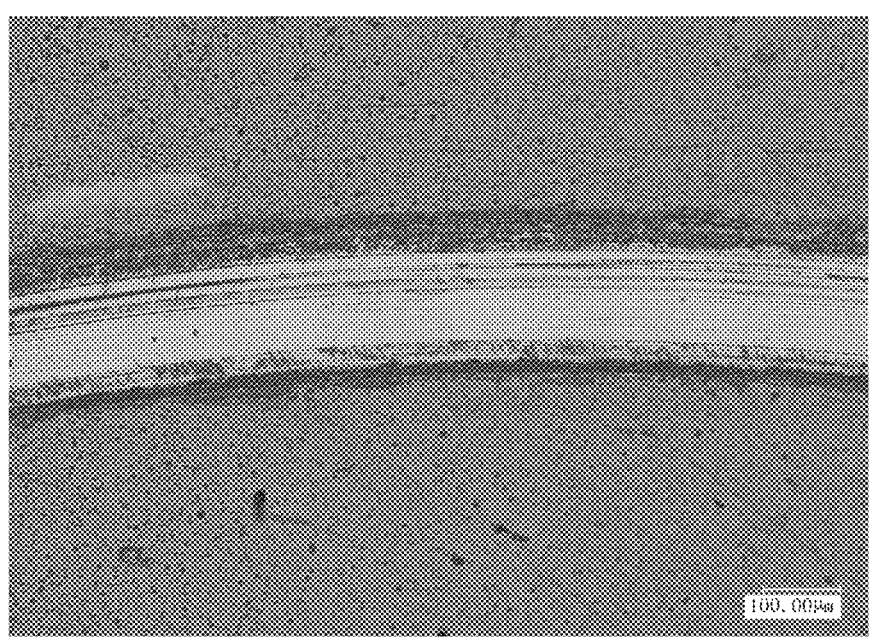
FIG. 11 shows the worn scar of the AlCrSiN/Mo film after grinding with alumina ball in embodiment 2.

FIG. 11 shows the wear morphology of the prepared AlCrSiN/Mo film (deposition pressure is 1.6 Pa) after grinding with an alumina ball. Although there are many micro furrows in the worn scar, the width of wear marks is narrow. The film hardness is up to 20.6 GPa, which reduces the effective contact area between the alumina ball and film. As a result, the wear resistance of the AlCrSiN/Mo film is improved, and its wear rate is as low as $1.52\times10^{-3}$ $\mu m^3/N\cdot\mu m$. The main wear mechanism of the film is still slight abrasive wear. In addition, Mo element is easy to be oxidized during the friction process to generate the layered $MoO_3$ with self-lubricating function, which can reduce friction coefficient.

Figure 12:
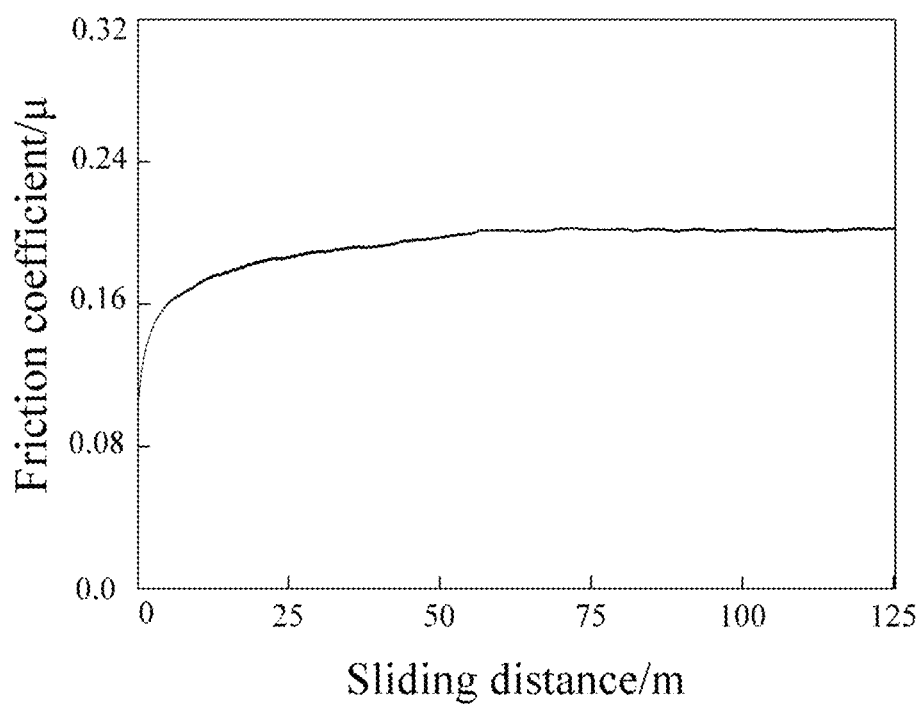
FIG. 12 shows the friction coefficient of the AlCrSiN/Mo film in embodiment 2.

FIG. 12 shows the friction coefficient of the prepared AlCrSiN/Mo film (deposition pressure is 1.6 Pa). In the running-in phase, the friction coefficient rises rapidly. As the friction process continues, the friction coefficient fluctuates slightly, which is attributed to the abrasive wear that occurs after spalling of hard particles inside the AlCrSiN/Mo film and transfer to the friction interface to participate in friction. The frequent spalling and transfer of hard particles during the friction process led to the fluctuation of friction coefficient. After friction entering steady-state phase, the friction coefficient of film finally stabilizes at about 0.18.

The above exemplarily describes the present invention. It shall be noted that any simple variation, amendment, or equivalent replacement that can be made by those skilled in the art without contributing creative work on the premise of not departing from the core of the present invention shall be included in the protection scope of the present invention.

We claim:

1. A Mo doped AlCrSiN/Mo self-lubricating film, prepared by doping an AlCrSiN/Mo film with Mo, comprising 14.3-25.5 at. % of Al, 14.3-36.2 at. % of Cr, 1.6-3.4 at. % of Si, 33.6-56.9 at. % of N, and 0.3-6.3 at. % of Mo.

2. The Mo doped AlCrSiN/Mo self-lubricating film according to claim 1, comprising AlN, CrN, and $Mo_2N$ nanocrystallines embedded in an amorphous phase.

3. A device, coated with the Mo doped AlCrSiN/Mo self-lubricating film according to claim 1, comprising a CrN transition layer disposed between the Mo doped self-lubricating AlCrSiN/Mo film and a substrate.

4. The device, according to claim 3, wherein the substrate is selected from stainless steel, monocrystal Si wafer, tungsten steel, and carbide.

5. The device according to claim 3, wherein the CrN transition layer has a thickness of 150-250 nm.

6. The Mo doped AlCrSiN/Mo self-lubricating film according to claim 1, having a thickness of 2.5-4.0 μm.

7. A preparation method, of the device according to claim 3, comprising:
affixing the substrate on a rotating holder in a coating chamber, then reducing a base pressure in coating chamber to less than $3.0\times10^{-3}$ Pa;
connecting a Cr target to an arc power supply, and connecting a CrMo target to a high power impulse magnetron sputtering power supply, and connecting a AlCrSi target to a pulsed DC magnetron sputtering power supply;
carrying out glow discharge cleaning on the substrate to remove surface impurities;
then conducting ion bombardment cleaning of the substrate;
depositing the CrN transition layer on the substrate;
depositing the Mo doped AlCrSiN/Mo self-lubricating film at a bias voltage to −50 to −150 V, with a gas flow containing $N_2$ at a flow rate of 50-150 sccm and Ar at a flow rate of 50-250 sccm and a pressure of 1.0-2.5 Pa in coating chamber, and at a sputtering power of CrMo target of 0.1-0.9 kW and a sputtering power of AlCrSi target of 0.2-1.5 kW.

8. The preparation method according to claim 7, wherein the substrate is cleaned in sequence in acetone and ethanol by ultrasonic cleaning for 10-35 min; and then blow-dried with nitrogen.

9. The preparation method according to claim 7, wherein the glow discharge cleaning is carried out at a bias voltage of −800 V, an Ar flow having a flow rate of 50-200 sccm, and a working pressure of 0.5-1.5 Pa for 5-15 min.

10. The preparation method according to claim 7, wherein the ion bombardment process uses the arc Cr target at an arc current at 80-100 A, and an arc voltage at 15 V-25 V, under an Ar flow with a flow rate of 50-200 sccm at a working pressure of $(5-10)\times10^{-1}$ Pa for 5-10 min.

11. The preparation method according to claim 10, after ion bombardment, a duration for depositing the CrN transition layer is 10-20 min.

* * * * *